(12) United States Patent
Nishioka

(10) Patent No.: US 10,930,363 B1
(45) Date of Patent: Feb. 23, 2021

(54) TSV AUTO REPAIR SCHEME ON STACKED DIE

(71) Applicant: MICRON TECHNOLOGY, INC., Boise, ID (US)

(72) Inventor: Naohisa Nishioka, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/590,789

(22) Filed: Oct. 2, 2019

(51) Int. Cl.
*G11C 29/12* (2006.01)
*G11C 7/10* (2006.01)
(Continued)

(52) U.S. Cl.
CPC ...... *G11C 29/12015* (2013.01); *G11C 7/1096* (2013.01); *G11C 7/222* (2013.01); *G11C 8/12* (2013.01); *G11C 8/18* (2013.01); *G11C 29/4401* (2013.01); *H01L 23/481* (2013.01); *H01L 24/05* (2013.01); *H01L 24/06* (2013.01); *H01L 24/16* (2013.01); *H01L 24/17* (2013.01); *H01L 25/0657* (2013.01); *H01L 25/18* (2013.01); *H01L 2224/0557* (2013.01); *H01L 2224/06181* (2013.01); *H01L 2224/16145* (2013.01); *H01L 2224/17181* (2013.01);
(Continued)

(58) Field of Classification Search
CPC . G11C 29/12015; G11C 7/1096; G11C 7/222; G11C 8/12; G11C 8/18; G11C 29/4401; H01L 23/481; H01L 24/05; H01L 24/06; H01L 24/16; H01L 24/17; H01L 25/0657; H01L 25/18; H01L 2224/0557; H01L 2224/06181; H01L 2224/16145; H01L 2224/17181; H01L 2225/06513; H01L 2225/06541; H01L 2225/06565; H01L 2924/1434
See application file for complete search history.

(56) References Cited

U.S. PATENT DOCUMENTS 9,401,312 B1 * 7/2016 Kannan ............ H03K 19/17736
2012/0069685 A1   3/2012 Ide et al.
(Continued)

OTHER PUBLICATIONS

Y. Chou, D. Kwai, M. Shieh and C. Wu, "Reactivation of Spares for Off-Chip Memory Repair After Die Stacking in a 3-D IC With TSVs," in IEEE Transactions on Circuits and Systems I: Regular Papers, vol. 60, No. 9, pp. 2343-2351, Sep. 2013. (Year: 2013).*
(Continued)

*Primary Examiner* — Kyle Vallecillo
(74) *Attorney, Agent, or Firm* — Dorsey & Whitney LLP

(57) ABSTRACT

Disclosed herein is an apparatus that includes a first semiconductor chip having a plurality of pad electrodes and a plurality of first latch circuits assigned to an associated one of the pad electrodes, a second semiconductor chip having a plurality of TSVs each electrically connected to an associated one of the pad electrodes and a plurality of second latch circuits assigned to an associated one of the TSVs, and a training circuit configured to perform a training operation on a signal path including the selected one of the pad electrodes and the selected one of the TSVs. The training circuit is configured to activate a fail signal when the signal path is determined to be defective. The fail signal is stored in the selected one of the first latch circuits and the selected one of the second latch circuits.

20 Claims, 11 Drawing Sheets

(51) Int. Cl.
*G11C 7/22* (2006.01)
*G11C 8/12* (2006.01)
*G11C 8/18* (2006.01)
*G11C 29/44* (2006.01)
*H01L 23/48* (2006.01)
*H01L 23/00* (2006.01)
*H01L 25/065* (2006.01)
*H01L 25/18* (2006.01)

(52) U.S. Cl.
CPC ............ *H01L 2225/06513* (2013.01); *H01L 2225/06541* (2013.01); *H01L 2225/06565* (2013.01); *H01L 2924/1434* (2013.01)

(56) References Cited

U.S. PATENT DOCUMENTS

| | | | |
|---|---|---|---|
| 2012/0105093 A1* | 5/2012 | Lee | H01L 22/32 |
| | | | 324/762.01 |
| 2012/0106229 A1* | 5/2012 | Kondo | G11C 11/4072 |
| | | | 365/63 |
| 2012/0114086 A1* | 5/2012 | Hayashi | G11C 11/4082 |
| | | | 375/354 |
| 2013/0082404 A1 | 4/2013 | Kajigaya et al. | |
| 2013/0230932 A1* | 9/2013 | Bringivijayaraghavan | |
| | | | H01L 22/22 |
| | | | 438/4 |
| 2015/0206825 A1 | 7/2015 | Park | |
| 2015/0262648 A1* | 9/2015 | Nishioka | G11C 29/025 |
| | | | 365/189.011 |
| 2015/0363258 A1* | 12/2015 | Shin | G06F 11/2017 |
| | | | 714/3 |
| 2017/0110169 A1 | 4/2017 | Kim et al. | |
| 2017/0110206 A1* | 4/2017 | Ryu | G11C 29/52 |
| 2017/0154655 A1* | 6/2017 | Seo | G11C 5/14 |
| 2017/0227605 A1* | 8/2017 | Kim | G01R 31/31723 |
| 2017/0301667 A1* | 10/2017 | Or-Bach | H01L 27/0688 |
| 2018/0122686 A1* | 5/2018 | Or-Bach | G11C 29/70 |
| 2018/0247876 A1 | 8/2018 | Kim et al. | |
| 2018/0277216 A1* | 9/2018 | Inoue | G11C 16/06 |
| 2019/0067359 A1* | 2/2019 | Matsumoto | H01L 27/14621 |
| 2019/0362804 A1* | 11/2019 | Kim | G01R 31/31851 |
| 2020/0027521 A1* | 1/2020 | Choi | G11C 7/18 |

OTHER PUBLICATIONS

C. Lee, W. Kang, D. Cho and S. Kang, "A New Fuse Architecture and a New Post-Share Redundancy Scheme for Yield Enhancement in 3-D-Stacked Memories," in IEEE Transactions on Computer-Aided Design of Integrated Circuits and Systems, vol. 33, No. 5, pp. 786-797, May 2014. (Year: 2014).*

U.S. Appl. No. 16/576,647 titled "TSV Check Circuit With Replica Path", filed Sep. 19, 2019.

U.S. Appl. No. 16/590,760 titled "Memory Core Chip Having TSVs", filed Oct. 2, 2019.

ISR/WO dated Dec. 24, 2020 for PCT Application No. PCT/US2020/052007, 13 pgs.

* cited by examiner

TSV AUTO REPAIR SCHEME ON STACKED DIE

BACKGROUND

A semiconductor chip used in a memory device such as an HBM (High Bandwidth Memory) often includes many TSVs (Through Silicon Vias) provided to penetrate through a semiconductor substrate. The TSVs provided on each semiconductor chip are connected to TSVs provided on another semiconductor chip and located at same planar positions via microbumps and pad electrodes, respectively, thereby forming signal paths penetrating through a plurality of semiconductor substrates. In a case where a certain TSV is in a poor conduction state or there is poor connection at a connection portion between two TSVs, an associated signal path is defective and cannot be practically used. In this case, a spare signal path is used instead of the defective signal path to recover the defect. Check of each signal path and replacement thereof with a spare signal path are performed not only at the manufacturing stage but may also be performed during an initialization period after power activation in a practical use.

However, if the circuit scale of a circuit required to check the signal paths during the initialization period is large or a great number of TSVs are additionally required, a problem of an increase in the chip size occurs.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
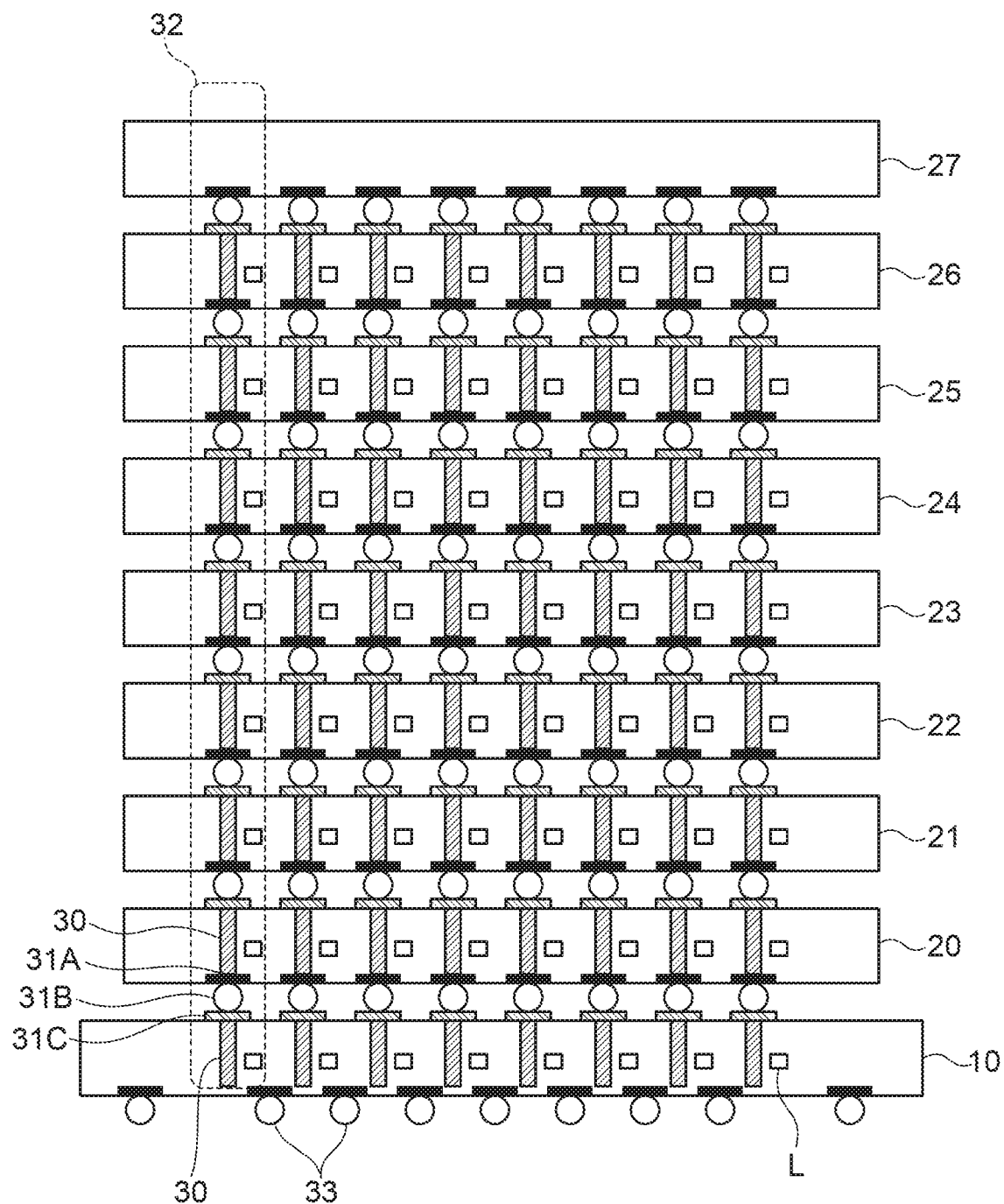
FIG. 1 is a schematic diagram showing a configuration of a semiconductor device according to the present disclosure.

A semiconductor device shown in FIG. 1 is an HBM having a structure in which eight memory core chips 20 to 27 are stacked one on top of another on an interface chip 10. However, subject matters of the present invention are not limited to the HBM. The memory core chips 20 to 27 are semiconductor chips on each of which memory cores each including a memory cell array are integrated. The interface chip 10 is a semiconductor chip that controls the memory core chips 20 to 27. Each of the interface chip 10 and the memory core chips 20 to 26 includes a plurality of TSVs 30 provided to penetrate through the corresponding semiconductor substrate. The interface chip 10 and the memory core chips 20 to 27 are all stacked by a face-down method, that is, in such a manner that principal surfaces on which transistors and wiring patterns (all not shown) are formed face downward. Accordingly, the memory core chip 27 located in the topmost layer does not need the TSVs 30. However, the memory core chip 27 located in the topmost layer may include the TSVs 30. Most of the TSVs 30 provided on the memory core chips 20 to 26 are connected to front TSV pads 31A located at same planar positions, respectively. In contrast thereto, majorities of the TSVs 30 provided on the interface chip 10 and the front TSV pads 31A provided on the interface chip 10 are located at different planar positions. The TSVs 30 located at the same planar positions among the TSVs 30 provided on the interface chip 10 and the memory core chips 20 to 26 are respectively cascade connected via the front TSV pads 31A, TSV bumps 31B, and back TSV pads 31C, so that a plurality of signal paths 32 are formed. Commands and write data output from the interface chip 10 are supplied to the memory core chips 20 to 27 via the signal paths 32. Read data output from the memory core chips 20 to 27 are supplied to the interface chip 10 via the signal paths 32. External terminals 33 are provided on the interface chip 10 and transmission/reception of signals to/from an external circuit is performed via the external terminals 33.

Some of the signal paths 32 are spare signal paths. The spare signal paths are used when a certain signal path 32 has a defect. As shown in FIG. 1, latch circuits L are assigned to the TSVs, respectively, and fail information is stored in latch circuits L corresponding to respective TSVs 30 in a defective signal path 32.

Figure 2:
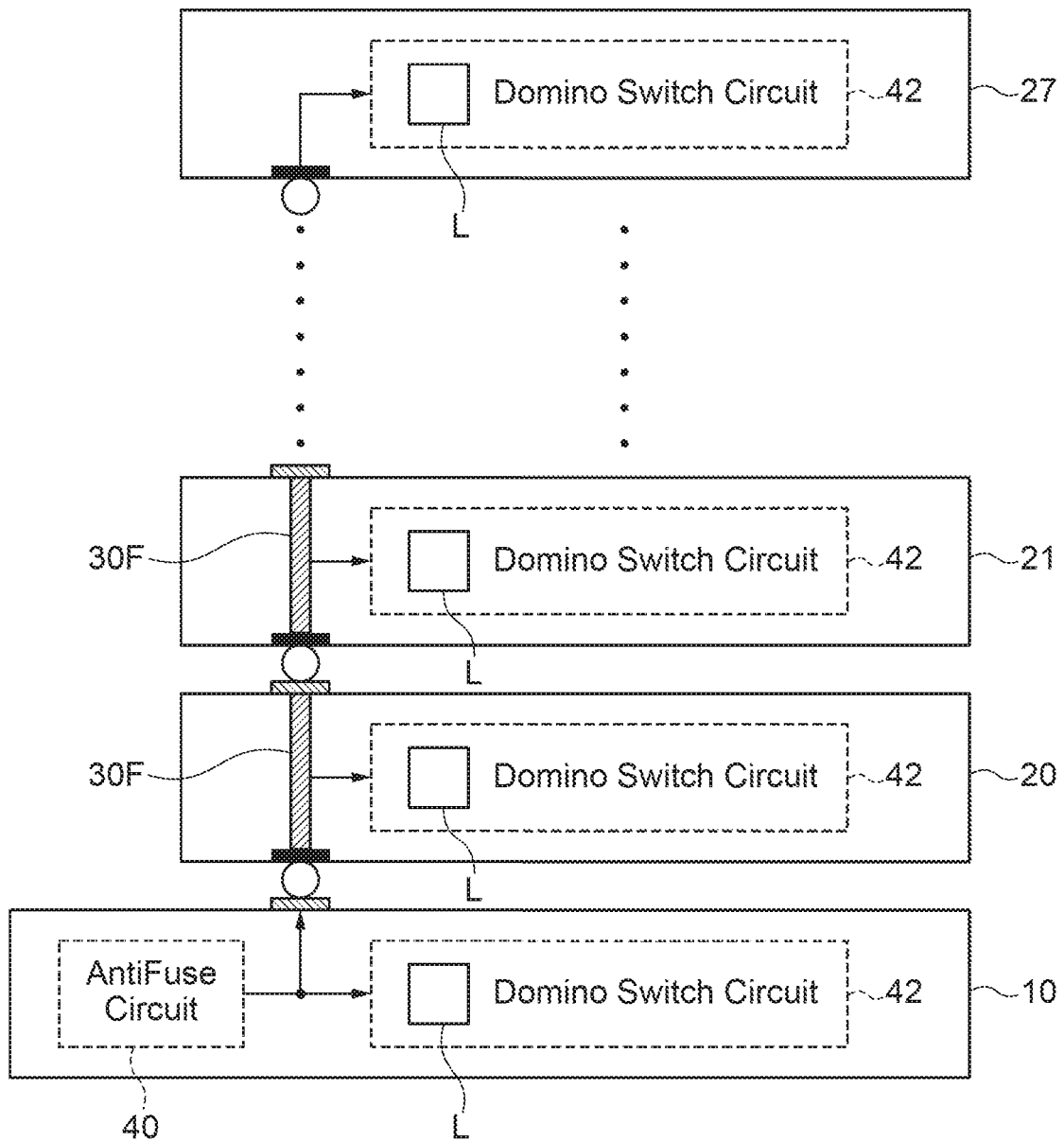
FIG. 2 is a schematic diagram for explaining a state where fail information is loaded into a domino switch circuit of each of chips.

When the fail information is stored in the latch circuits L, connection relations between an internal circuit of the interface chip 10 and internal circuits of the memory core chips 20 to 27, and the TSVs 30 are switched, so that a spare path is used instead of the defective signal path. As shown in FIG. 2, a domino switch circuit 42 is provided in each of the interface chip 10 and the memory core chips 20 to 27. The domino switch circuits 42 are circuits for switching the connection relations between the internal circuit of the interface chip 10 and the internal circuits of the memory core chips 20 to 27, and the TSVs 30 and the connection relations between the internal circuit of the interface chip 10 and the internal circuits of the memory core chips 20 to 27, and the TSVs 30 are switched on the basis of the fail information stored in the latch circuits L. The fail information is first read from an antifuse circuit 40 during an initialization period after power activation and is loaded in common into the latch circuits L of the interface chip 10 and the memory core chips 20 to 27. Transfer of the fail information is performed through TSVs 30F for fail information transfer. Writing of the fail information to the antifuse circuit 40 is performed on the basis of a result of a screening test performed at the manufacturing stage.

Figure 3A:
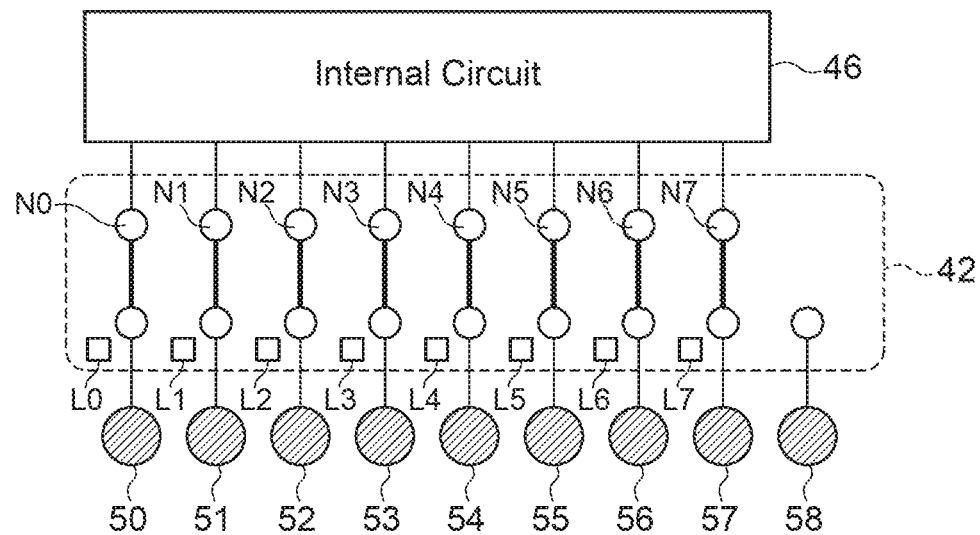
FIG. 3A is a schematic diagram for explaining a connection relation in a state where replacement by the domino switch circuit is not performed.
Figure 3B:
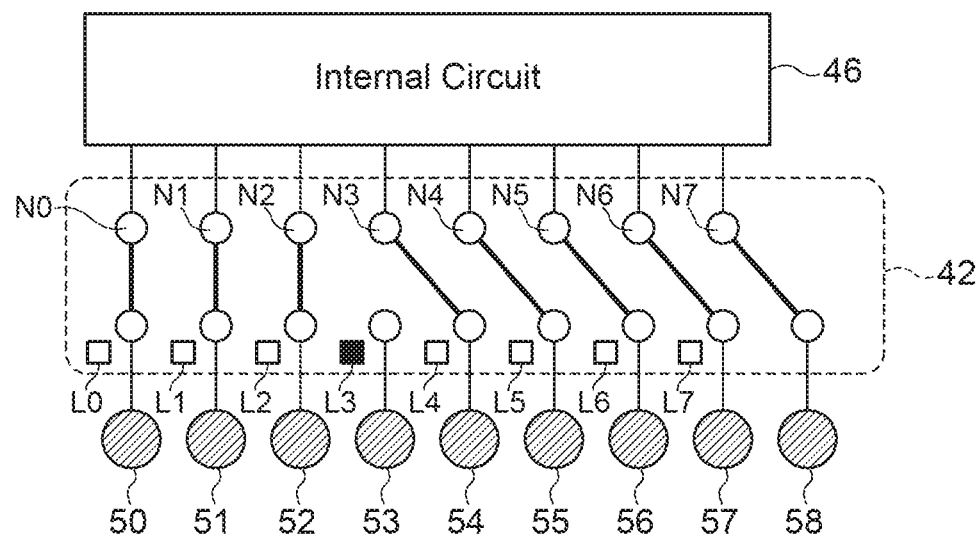
FIG. 3B is a schematic diagram for explaining a connection relation in a state where replacement by the domino switch circuit is performed.

As shown in FIG. 3A, each of the domino switch circuits 42 is connected between a plurality of input/output nodes of an internal circuit 46 and a plurality of the TSVs 30. In an example shown in FIG. 3A, the internal circuit 46 has eight input/output nodes N0 to N7 and nine TSVs 50 to 58 are assigned correspondingly thereto. Among these TSVs, eight TSVs 50 to 57 are original TSVs and one TSV 58 is a spare TSV. Corresponding latch circuits L0 to L7 are respectively assigned to the TSVs 50 to 57. In the example shown in FIG. 3A, the fail information is not stored in the latch circuits L0 to L7. In this case, the domino switch circuit 42 connects the input/output nodes N0 to N7 and the TSVs 50 to 57, respectively. Therefore, the spare TSV 58 is not used in this case. In contrast thereto, when the fail information is stored in, for example, the latch circuit L3 as shown in FIG. 3B, the domino switch circuit 42 connects the input/output nodes N0 to N7 and the TSVs 50 to 52 and 54 to 58, respectively. Accordingly, the TSV 53 corresponding to the latch circuit L3 is invalidated. In this way, the domino switch circuits 42 achieve recovery of a defect by shifting the connection relation between the input/output nodes N0 to N7 and the TSVs 50 to 58, without simply replacing a TSV to which the fail information is assigned with the spare TSV.

The semiconductor device according to the present disclosure performs an auto repair operation after loading the fail information read from the antifuse circuit 40 during the initialization period after power activation into the latch circuits L of the interface chip 10 and the memory core chips 20 to 27. The auto repair operation is a training operation to test respective connection states of the signal paths 32 and overwrite the fail information to the latch circuits L on the basis of a result of the test. A defect on a signal path is found in a screening test performed at the manufacturing stage and the fail information is written to the antifuse circuit 40 on the basis thereof. Accordingly, a defective signal path is replaced with a spare signal path. However, there are rare cases where a defective signal path newly emerges due to temporal changes after shipment. An operation to find such a defect emerging afterward and to replace a defective signal path with a spare signal path is the auto repair operation. Because the auto repair operation needs to be finished during the initialization period after power activation, the time allocable to one signal path 32 is quite short. In the present embodiment, an auto repair circuit is incorporated in the interface chip 10 and the memory core chips 20 to 27 to automatically perform the auto repair operation without the need of control by an external controller.

Figure 4:
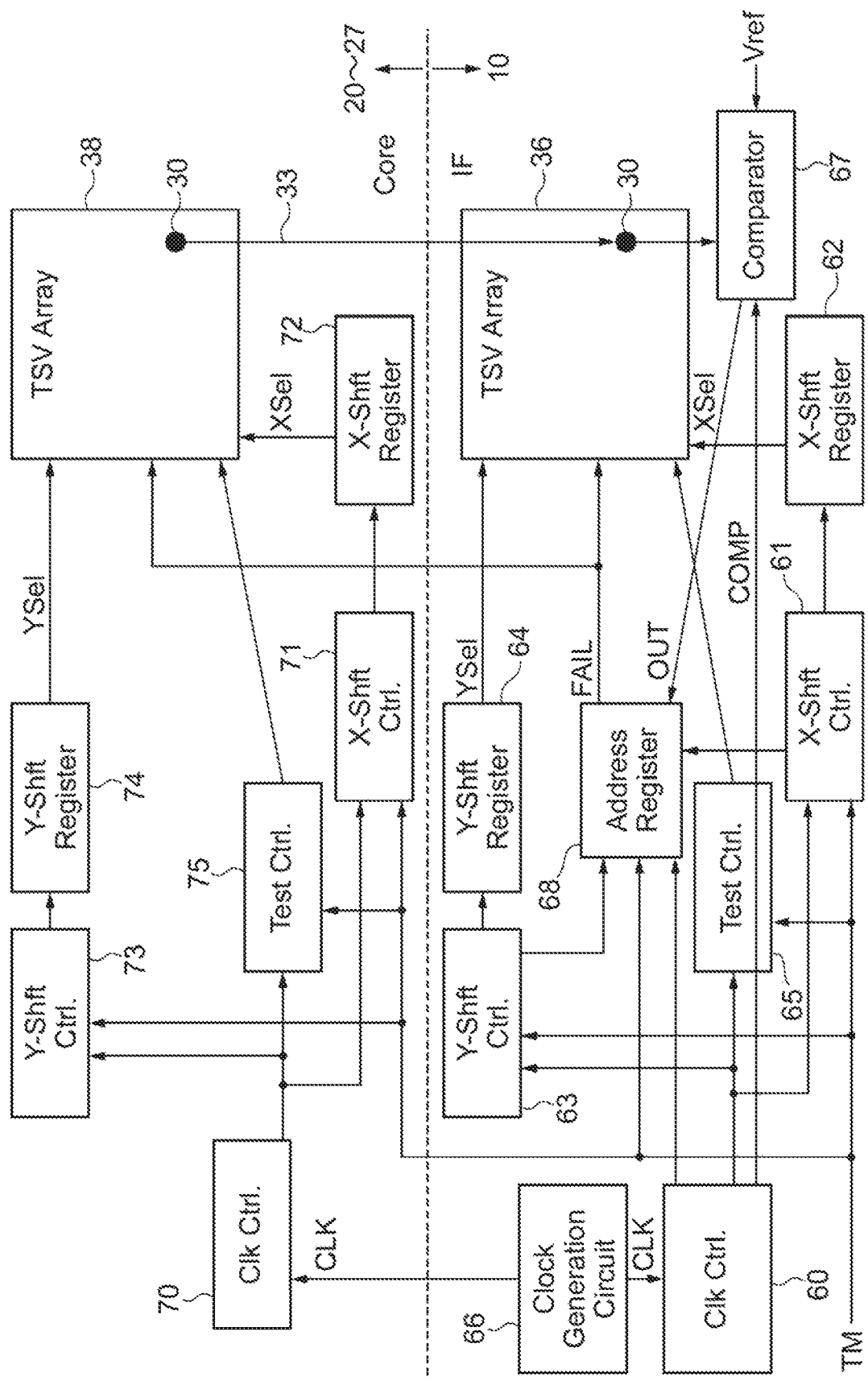
FIG. 4 is a block diagram for explaining a configuration of an auto repair circuit.

As shown in FIG. 4, the auto repair circuit is provided in the interface chip 10 and the memory core chips 20 to 27. A clock control circuit 60, an X-address control circuit 61, an X-shift register 62, a Y-address control circuit 63, a Y-shift register 64, and a test control circuit 65 are provided in the interface chip 10. A clock control circuit 70, an X-address control circuit 71, an X-shift register 72, a Y-address control circuit 73, a Y-shift register 74, and a test control circuit 75 are provided in each of the memory core chips 20 to 27. The aforementioned circuits 60 to 65 provided in the interface chip 10 and the aforementioned circuits 70 to 75 provided in each of the memory core chips 20 to 27 have same circuit configurations, respectively. The interface chip 10 further includes a clock generation circuit 66, a comparator 67, and an address register 68. The clock generation circuit 66 includes an oscillator and automatically generates a test clock signal CLK. The test clock signal CLK is supplied to the clock control circuit 60 included in the interface chip 10 and is also supplied to the clock control circuit 70 included in each of the memory core chips 20 to 27. The clock control circuit 60 controls operation timings of the X-address control circuit 61, the Y-address control circuit 63, the test control circuit 65, and the address register 68. The clock control circuit 70 controls operation timings of the X-address control circuit 71, the Y-address control circuit 73, and the test control circuit 75. A test of the auto repair operation can also be performed by inputting a test mode signal TM to these circuits 61, 63, 65, 71, 73, and 75.

The comparator 67 is a circuit that compares the potential of a selected signal path 32 with a reference potential Vref. The comparator 67 compares the potential of the selected signal path 32 with the reference potential Vref at a timing when a comparison signal COMP is activated, and generates an output signal OUT on the basis of a result of the comparison. The output signal OUT is supplied to the address register 68. The address register 68 generates a fail signal FAIL on the basis of the output signal OUT. The fail signal FAIL is supplied in common to TSV areas 36 and 38. The address register 68 further retains the address of a defective signal path 32, thereby also performing a determination operation to determine whether a defective signal path 32 can be recovered by a spare signal path when the fail signal FAIL is activated next. The address retained in the address register 68 may be readable to outside by a test mode operation.

The TSVs 30 provided on the interface chip 10 are arranged in an array in the TSV area 36. Any one of the TSVs 30 arranged in an array in the TSV area 36 can be selected using a TSV selection signal Xsel output from the X-shift register 62 and a TSV selection signal Ysel output from the Y-shift register 64. Similarly, the TSVs 30 provided on each of the memory core chips 20 to 27 are arranged in an array in the TSV area 38. Any one of the TSVs arranged in an array in the TSV area 38 can be selected using a TSV selection signal Xsel output from the X-shift register 72 and a TSV selection signal Ysel output from the Y-shift register 74.

Figure 5:
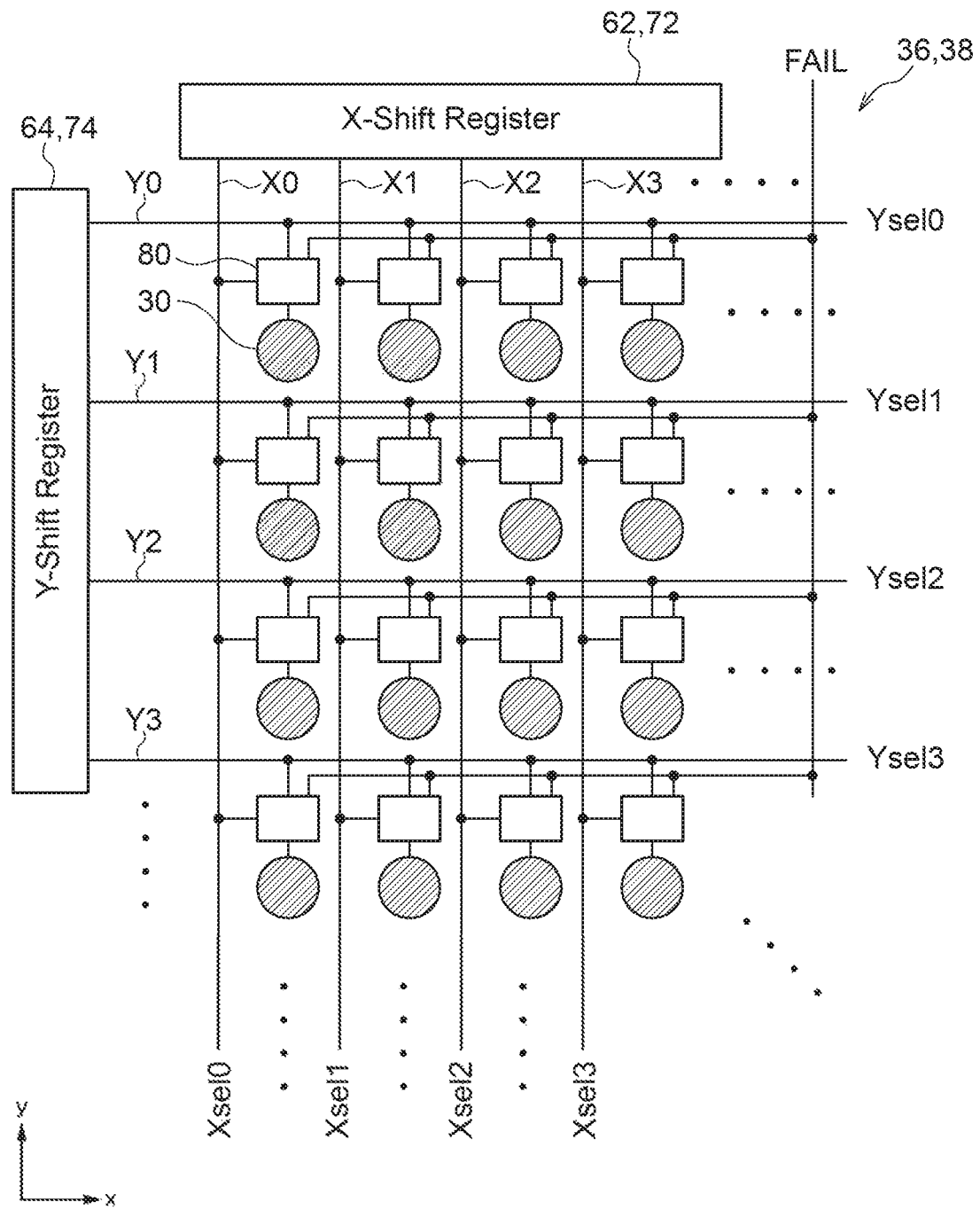
FIG. 5 is a schematic plan view showing a layout of TSVs in TSV areas.

As shown in FIG. 5, the TSVs 30 are laid out in a matrix in the TSV areas 36 and 38. A selection circuit 80 is assigned to each of the TSVs 30. The selection circuits 80 are used in a check of the signal paths 32, which is performed at the manufacturing stage and during the initialization period after power activation. As shown in FIG. 5, corresponding selection signal lines Y0, Y1, Y2, Y3, . . . are assigned to pluralities of TSVs 30 arrayed in an x direction, respectively, and corresponding selection signal lines X0, X1, X2, X3, . . . are assigned to pluralities of TSVs 30 arrayed in a y direction, respectively. The selection signal lines Y0, Y1, Y2, Y3, . . . supply TSV selection signals Ysel0, Ysel1, Ysel2, Ysel3, . . . to corresponding ones of the selection circuits 80, respectively. The selection signal lines X0, X1, X2, X3, . . . supply TSV selection signals Xsel0, Xsel1, Xsel2, Xsel3, . . . to corresponding ones of the selection circuits 80, respectively. The Y-shift registers 64 and 74 activate any one of the TSV selection signals Ysel0, Ysel1, Ysel2, Ysel3, . . . and deactivate all the other TSV selection signals. The X-shift registers 62 and 72 activate any one of the TSV selection signals Xsel0, Xsel1, Xsel2, Xsel3, . . . and deactivate all the other TSV selection signals. Accordingly, any one of the selection circuits 80 is activated and a TSV 30 corresponding thereto is selected.

Figure 6:
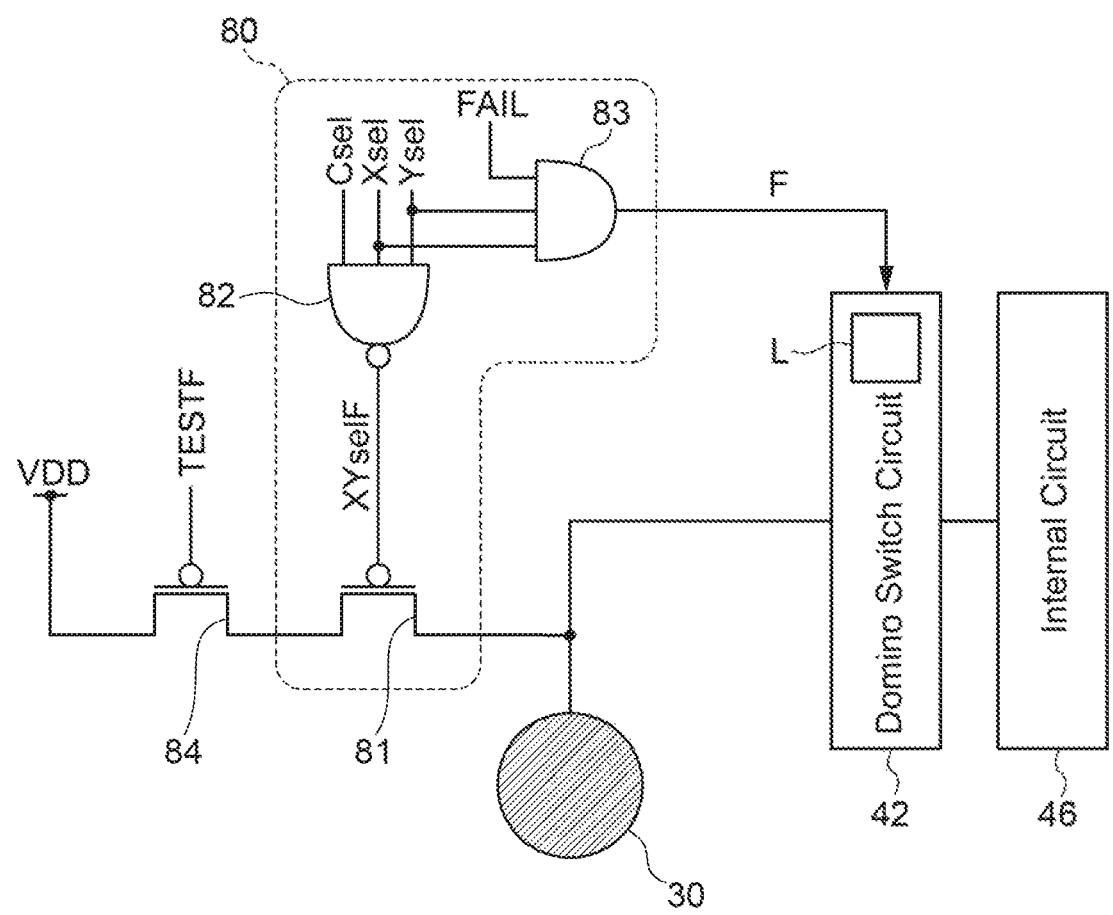
FIG. 6 is a circuit diagram of a selection circuit included in memory core chips.

Each of the selection circuits 80 included in the memory core chips 20 to 27 includes a P-channel MOS transistor 81, a NAND gate circuit 82 that control the transistor 81, and an AND gate circuit 83 that controls the corresponding latch circuit L included in the domino switch circuit 42 as shown in FIG. 6. The NAND gate circuit 82 receives a corresponding one of the TSV selection signals Xsel0, Xsel1, Xsel2, Xsel3, . . . , a corresponding one of the TSV selection signals Ysel0, Ysel1, Ysel2, Ysel3, . . . , and one of memory core selection signals Csel0, Csel1, Csel2, Csel3, . . . for selecting one of the memory core chips 20 to 27, and activates a TSV selection signal XYselF to a low level when these selection signals are all in an active level (a high level). In the memory core chips 20 to 27, a P-channel MOS transistor 84 and the P-channel MOS transistor 81 are connected in series between a power supply VDD and the TSVs 30. A gate electrode of the transistor 84 is supplied with a test signal TESTF. The test signal TESTF is a signal activated at the time of an auto repair operation. Accordingly, when both the test signal TESTF and the TSV selection signal XYselF are activated to a low level, an associated one of the TSVs 30 is connected to the power supply VDD. The power supply VDD is, for example, a power supply on a high potential side and an associated signal path 32 is charged via the TSV 30 in this case when both the test signal TESTF and the TSV selection signal XYselF are activated.

The AND gate circuit 83 receives the corresponding one of the TSV selection signals Xsel0, Xsel1, Xsel2, Xsel3, . . . , the corresponding one of the TSV selection signals Ysel0, Ysel1, Ysel2, Ysel3, . . . , and the fail signal FAIL and activates a flag F to a high level when these signals are all in an active level (a high level). The flag F is supplied to the domino switch circuit 42 and the fail information is accordingly written to one of the latch circuits L corresponding to the associated TSV 30.

Figure 7:
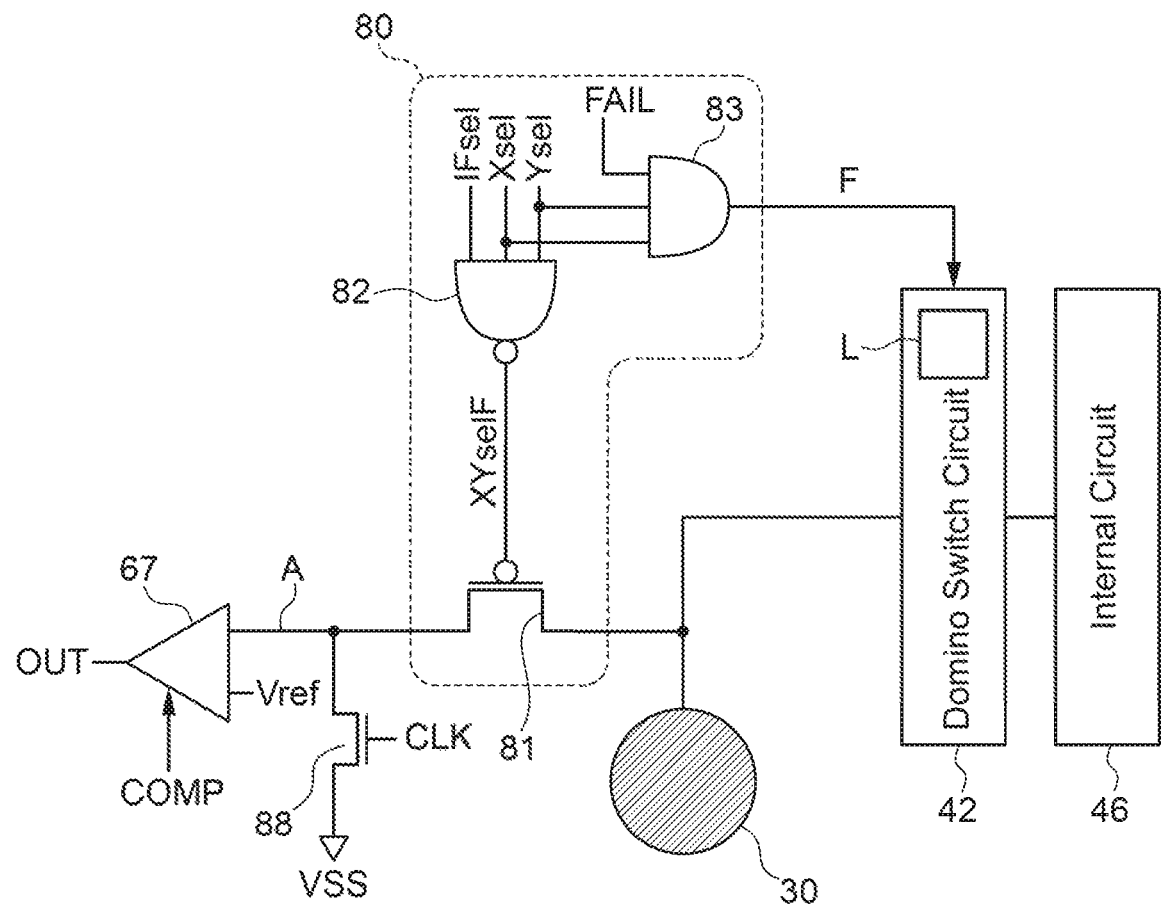
FIG. 7 is a circuit diagram of a selection circuit included in an interface chip.

The selection circuits 80 included in the interface chip 10 have a same circuit configuration to that of the selection circuits 80 in the memory core chips 20 to 27 as shown in FIG. 7 except that an interface chip selection signal IFsel is used instead of the memory core selection signals Csel0, Csel1, Csel2, Csel3, . . . . In the interface chip 10, the transistor 81 and an N-channel MOS transistor 88 are connected in series between the TSVs 30 and a power supply VSS. A gate electrode of the transistor 88 is supplied with the test clock signal CLK. Accordingly, when the test clock signal CLK is activated to a high level and the TSV selection signal XYselF is activated to a low level, an associated one of the TSVs 30 is connected to the power supply VSS. The power supply VSS is, for example, a power supply on a low potential side and an associated signal path 32 is discharged via the TSV 30 in this case when both the test clock signal CLK and the selection signal XYselF are activated.

As shown in FIGS. 6 and 7, the domino switch circuit 42 is connected between the internal circuit 46 included in the interface chip 10 or the memory core chips 20 to 27 and the TSVs 30. The function of the domino switch circuit 42 is as explained with reference to FIGS. 3A and 3B. When the fail information is written to one of the latch circuits L, one of the TSVs 30 corresponding thereto is invalidated and a spare TSV (the TSV 58 shown in FIGS. 3A and 3B, for example) is validated instead.

Figure 8:
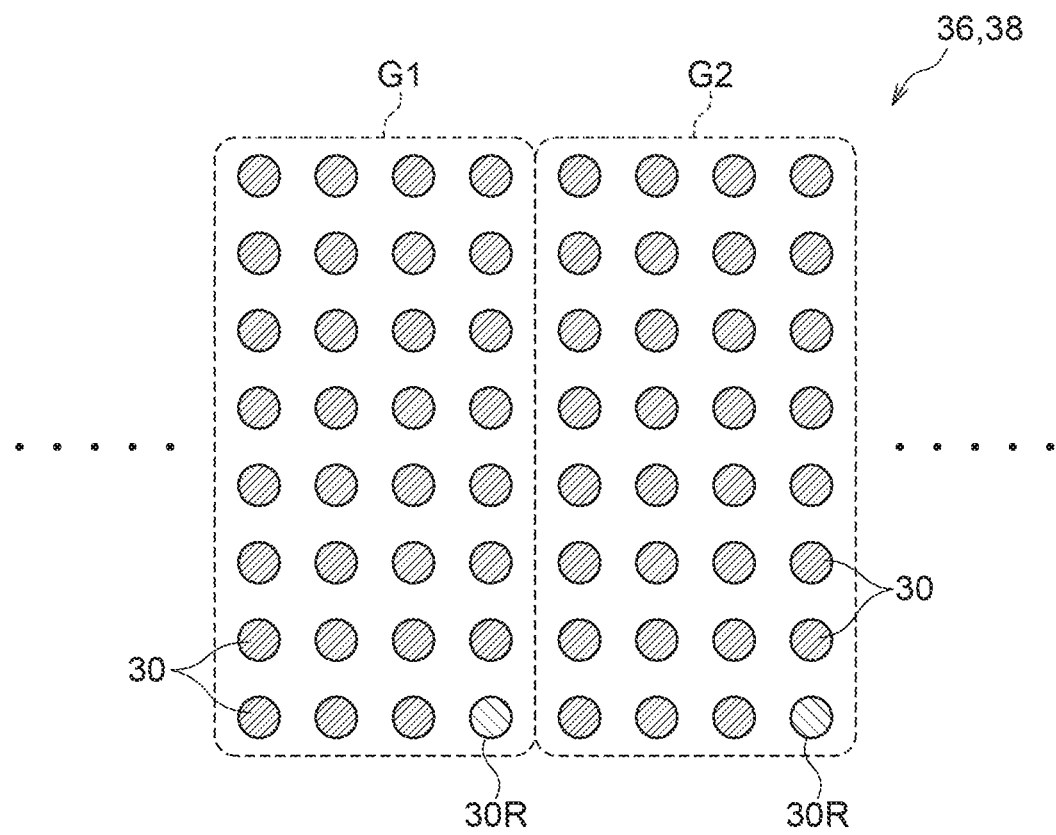
FIG. 8 is a schematic diagram for explaining grouping in the TSV areas.

As shown in FIG. 8, regular TSVs 30 located in the TSV areas 36 and 38 are divided into a plurality of groups G1, G2, . . . , and one or more spare TSVs 30R are assigned to each group. Accordingly, the number of TSVs 30 that can be recovered per group is limited to the number of spare TSVs 30R included in the associated group. When generating the fail signal FAIL, the address register 68 retains the address of a signal path 32 corresponding thereto, thereby determining whether a signal path 32 can be recovered by a spare signal path when the fail signal FAIL is activated next. When a result of the determination indicates that no signal path 32 can be recovered, that is, when no spare TSV 30R belonging to the associated group remains, the fail signal FAIL is not activated.

Figure 9:
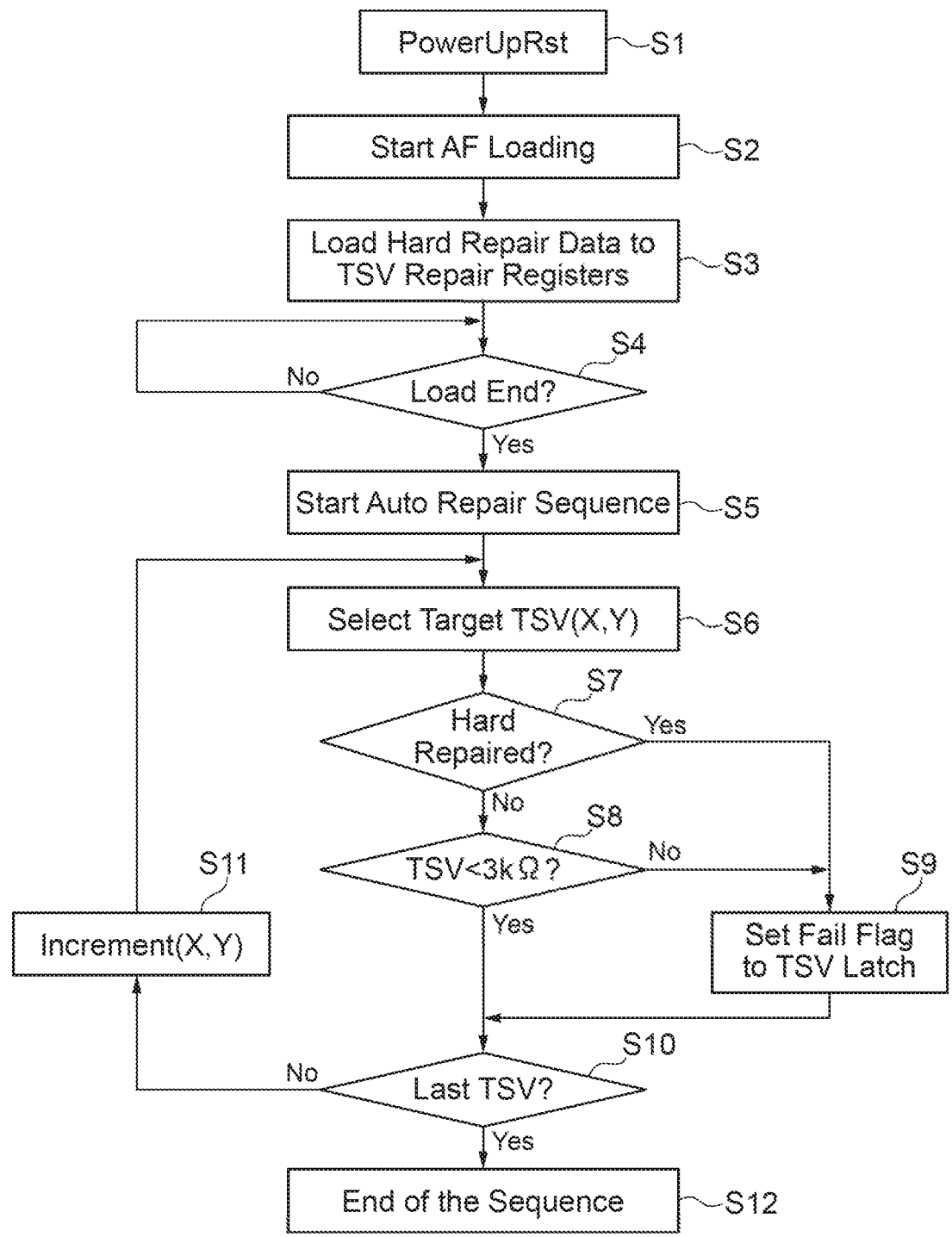
FIG. 9 is a flowchart for explaining an auto repair operation.

The auto repair operation is explained next. As shown in FIG. 9, when the device is powered up and a reset signal PowerUpRst is activated (Step S1), the fail information is read from the antifuse circuit 40 shown in FIG. 2 (Step S2) and is loaded into the domino switch circuits 42 included in the interface chip 10 and the memory core chips 20 to 27. Accordingly, the fail information is written to ones of the latch circuits L corresponding to a defective signal path 32 (Step S3), ones of the TSVs 30 corresponding thereto are invalidated, and a spare TSV 30R is validated. This operation is called "hard repair". When the hard repair is completed (YES at Step S4), the auto repair operation is started (Step S5). When the auto repair operation is started, the clock control circuits 60 and 70 are activated. Accordingly, the X-shift registers 62 and 72 sequentially activate the TSV selection signals Xsel in synchronization with the test clock signal CLK, and the Y-shift registers 64 and 74 sequentially activate the TSV selection signals Ysel in synchronization with the test clock signal CLK (Step S6). At this time, the X-shift register 62 included in the interface chip 10 and the X-shift registers 72 included in the memory core chips 20 to 27 activate same TSV selection signals Xsel, respectively, and the Y-shift register 64 included in the interface chip 10 and the Y-shift register 74 included in the memory core chips 20 to 27 activate same TSV selection signals Ysel, respectively. That is, the interface chip 10 and the memory core chips 20 to 27 perform same operations, respectively, whereby the signal paths 32 are sequentially tested (Step S8). When it is determined as a result of the test that a signal path 32 is defective (NO at Step S8), the fail signal FAIL is activated and is latched into corresponding ones of the latch circuits L (Step S9). In an example shown in FIG. 9, it is confirmed that the resistance value of the signal path 32 is tower than 3K ohm at Step S8. However, the value to be compared with is not limited to 3K ohm and can be other values. However, as for a signal path 32 where replacement has been already performed on the basis of the fail information from the antifuse circuit 40 (YES at Step S7), the fail signal FAIL is activated regardless of the test result (Step S9). Whether the signal path 32 to be tested is the last signal path is then determined (Step S10). When the signal path 32 is not the last signal path (NO at Step S10), the TSV selection signals Xsel and Ysel are incremented (Step S11). On the other hand, when the signal path 32 to be tested is the last signal path (YES at Step S10), the auto repair operation is ended (Step S12).

Figure 10:
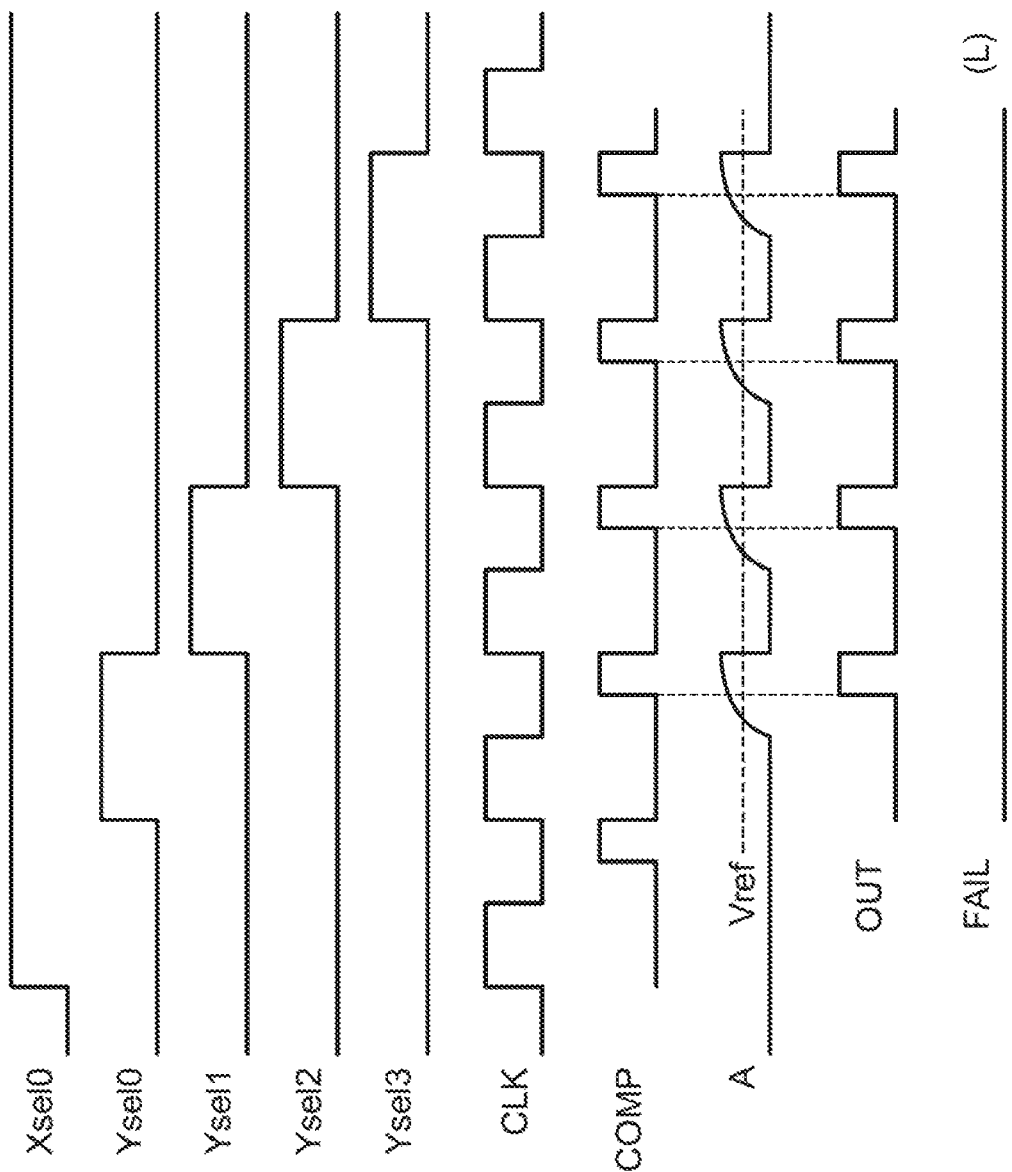
FIG. 10 is a waveform diagram of each signal during an auto repair operation and shows waveforms in a case where respective signal paths include no defect.
Figure 11:
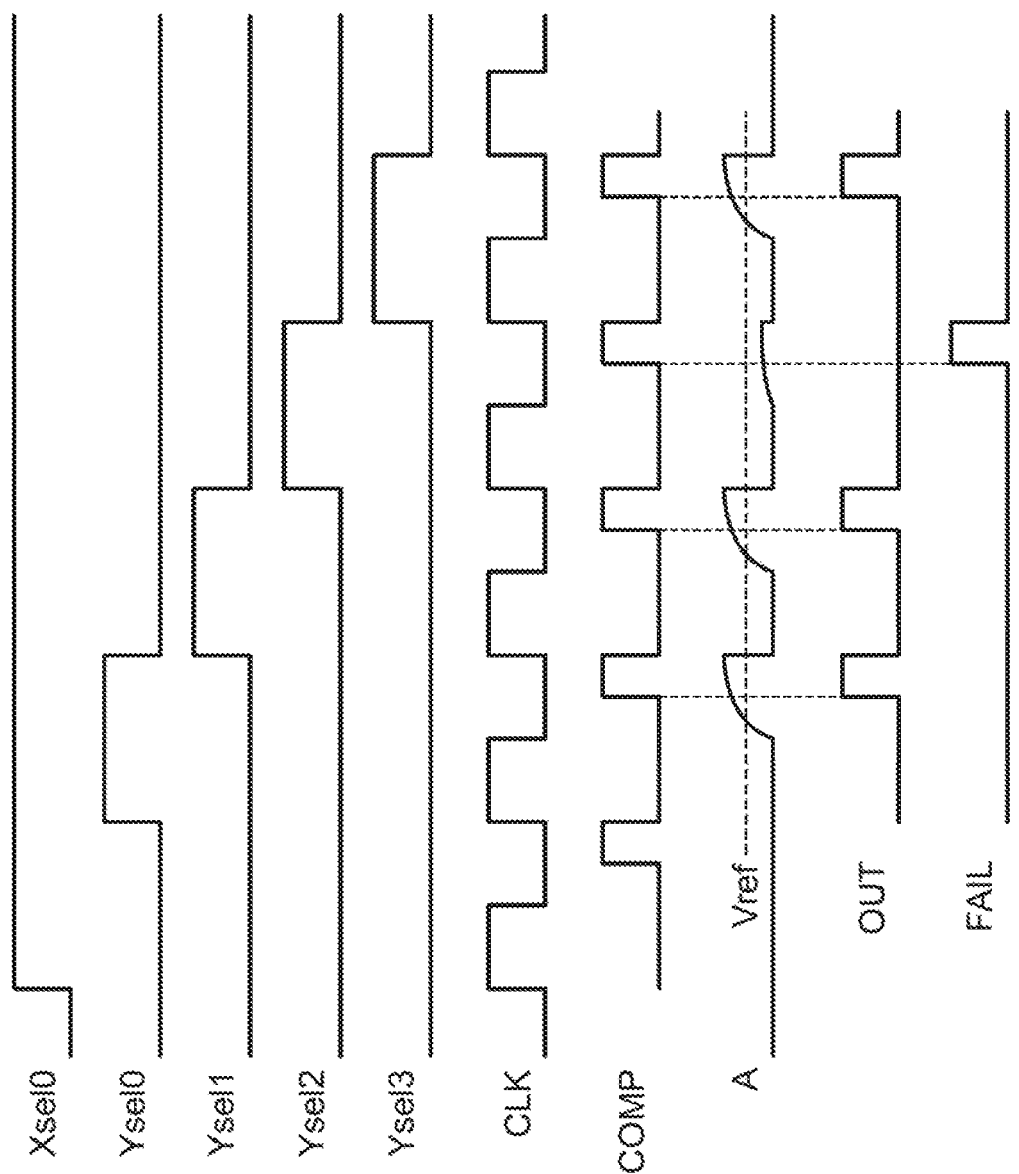
FIG. 11 is a waveform diagram of each signal during an auto repair operation and shows waveforms in a case where some of the signal paths include a defect.

Waveforms of the signals in the auto repair operation are explained with reference to FIGS. 10 and 11. FIG. 10 shows waveforms in a case where the signal paths 32 include no defect and FIG. 11 shows waveforms in a case where some of the signal paths 32 include a defect. First, the TSV selection signals Ysel0, Ysel1, Ysel2, Ysel3, . . . are sequentially activated to a high level in a state where any (the selection signal Xsel0 in the examples shown in FIGS. 10 and 11) of the TSV selection signals Xsel0, Xsel1, Xsel2, Xsel3, . . . is activated to a high level. Accordingly, a plurality of TSVs 30 arrayed in a matrix as shown in FIG.

5 are sequentially selected and an associated signal path 32 is charged via the selected TSV 30. It suffices to perform charging of the signal path 32 in any one of the memory core chips 20 to 27 and charging in the other memory core chips is not required. It is preferable to perform charging of the signal path 32 in the memory core chip 27 in the topmost layer. In this case, it suffices to activate the memory core selection signal Csel corresponding to the memory core chip 27 in the topmost layer while maintaining the memory core selection signals Csel corresponding to the other memory core chips 20 to 26 in an inactive state.

As shown in FIGS. 10 and 11, one cycle of the test clock signal CLK is equal to an activation period of the selection signals Ysel0, Ysel1, Ysel2, Ysel3, . . . . Accordingly, the transistor 88 is on during the former half of a period in which one signal path 32 is selected, so that the selected signal path 32 is discharged and a node A in the interface chip 10 becomes a VSS level. Meanwhile, the transistor 88 is off during the latter half of the period in which one signal path 32 is selected, so that discharging of the selected signal path 32 stops. When discharging of the signal path 32 stops, a signal path 32 selected via the transistor 81 is charged and therefore the level of the node A in the interface chip 10 increases. At this time, the increase rate of the level of the node A depends on the resistance value and the parasitic capacitance of the signal path 32. FIG. 10 shows the waveforms in the case where the signal paths 32 include no defect and the level of the node A exceeds the reference potential Vref promptly after the test clock signal CLK changes to a low level. The comparison signal COMP is activated at a timing before the test clock signal CLK changes again to a high level after having changed from the high level to the low level. When the comparison signal COMP is activated, the comparator 67 compares the level of the node A with the reference potential Vref and sets the output signal OUT to a high level when the level of the node A is higher. This means that the signal path 32 does not include a defect, for example, the resistance value is lower than 3K ohm. In this case, the fail signal FAIL is kept in an inactive state. In the circuit examples shown in FIGS. 6 and 7, the node A is charged to VDD and then is discharged to VSS, and the level thereof is compared with the reference potential Vref in this state. However, the node A can be discharged to VSS and then be charged to VDD, and the level thereof can be compared with the reference potential Vref in this state. In this case, a signal indicating an inversion of the comparison result is used as the output signal OUT.

Meanwhile, FIG. 11 shows the waveforms in the case where a signal path 32 corresponding to the selection signals Xsel0 and Ysel2 includes a defect. When a signal path 32 includes a defect, the resistance value increases and the charging rate of the signal path 32 decreases. It is considered that a defect of a signal path 32 occurs in a case where the resistance value of an associated TSV 30 itself is increased or a case where the resistance value is increased due to a defect at a connection portion via the front TSV pads 31A, TSV bumps 31B, and back TSV pads 31C. When the resistance value of the signal path 32 is high, increase in the level of the associated node A is slowed and the level of the node A becomes lower than the reference potential Vref at a timing when the comparison signal COMP is activated. Accordingly, the comparator 67 switches the output signal OUT to a low level. This means that the signal path 32 includes a defect, for example, the resistance value is equal to or higher than 3K ohm, and the fail signal FAIL is activated in this case.

As shown in FIG. 4, the fail signal FAIL is supplied in common to the TSV areas 36 and 38 of the interface chip 10 and the memory core chips 20 to 27. That is, the fail signal FAIL is supplied to all the selection circuits 80. However, the flag F is activated on the basis of the fail signal FAIL only in ones of the selection circuits 80 in a selected state and the flag F is not activated in the other selection circuits 80 even when the fail signal FAIL is activated. Accordingly, only the flag F corresponding to a signal path 32 to be tested is activated and the fail information is written to corresponding ones of the latch circuits L included in the domino switch circuits 42. As described above, when the fail information is written to the latch circuits L, the associated signal path 32 is invalidated and is replaced with a spare signal path.

As described above, in the semiconductor device according to the present disclosure, the auto repair operation is performed during the initialization period after power activation. Therefore, a signal path that becomes defective afterward due to temporal changes is invalidated and a spare signal path is validated to enable recovery of the defect. Furthermore, the TSV selection signals Xsel and Ysel used in the auto repair operation are automatically generated inside the interface chip 10 and the memory core chips 20 to 27. Therefore, there is no need to provide TSVs for transferring the TSV selection signals Xsel and Ysel. Further, because the determination operation using the comparator 67 and the transfer operation of the fail signal FAIL are alternately performed, the fail information can be selectively written to predetermined ones of the latch circuits L by supplying the fail signal FAIL of one bit in common to all the selection circuits 80 in the interface chip 10 and the memory core chips 20 to 27.

The auto repair operation described above can also be performed in a screening test performed at the manufacturing stage. For example, by performing the auto repair operation after specifying a defective signal path 32 on the basis of a result of the screening test and before writing the fail information to the antifuse circuit 40, whether the auto repair operation functions normally can be tested.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:
1. An apparatus comprising:
   a first semiconductor chip having a plurality of pad electrodes and a plurality of first latch circuits assigned to an associated one of the pad electrodes;
   a second semiconductor chip having a plurality of TSVs each electrically connected to an associated one of the pad electrodes and a plurality of second latch circuits assigned to an associated one of the TSVs;

a clock generation circuit formed on the first semiconductor chip and configured to generate a clock signal;
a first selection circuit formed on the first semiconductor chip and configured to update a first selection signal based on the clock signal, wherein the first selection signal selects one of the pad electrodes and one of the first latch circuits;
a second selection circuit formed on the second semiconductor chip and configured to update a second selection signal based on the clock signal, wherein the second selection signal selects one of the TSVs and one of the second latch circuits; and
a training circuit configured to perform a training operation on a signal path including the selected one of the pad electrodes and the selected one of the TSVs,
wherein the training circuit is configured to activate a fail signal when the signal path is determined to be defective, and
wherein the fail signal is stored in the selected one of the first latch circuits and the selected one of the second latch circuits.

2. The apparatus of claim 1, wherein the first and second selection circuits are configured to update the first and second selection signals each time the clock signal changes from a first logic level to a second logic level so as to keep the first and second selection signals the same value.

3. The apparatus of claim 2, wherein the training circuit includes:
a first circuit formed on the first semiconductor chip and configured to apply a first potential when the clock signal is in the second logic level;
a second circuit formed on the second semiconductor chip and configured to apply a second potential different from the first potential when the clock signal is in the first logic level; and
a third circuit formed on the first semiconductor chip and configured to detect a potential of the signal path at a predetermined timing during a period when the clock signal is in the first logic level.

4. The apparatus of claim 3, wherein the third circuit is configured to activate the fail signal when the potential of the signal path does not reach a reference potential.

5. The apparatus of claim 4, wherein the fail signal is transferred to the first and second latch circuits before the clock signal changes from the first logic level to the second logic level.

6. The apparatus of claim 1, wherein the signal path is invalidated when the first latch circuit assigned to the selected one of the pad electrodes and the second latch circuit assigned to the selected one of the TSVs store the fail signal.

7. The apparatus of claim 6,
wherein the first semiconductor chip further has a spare pad electrode,
wherein the second semiconductor chip further has a spare TSV, and
wherein a spare signal path including the spare pad electrode and the spare TSV is validated instead of the signal path determined to be defective.

8. The apparatus of claim 3, further comprising a plurality of third semiconductor chips arranged between the first and second semiconductor chips,
wherein each of the third semiconductor chips has substantially the same circuit configuration as the second semiconductor chip.

9. An apparatus comprising:
a first semiconductor chip including a plurality of pad electrodes, a plurality of first latch circuits assigned to an associated one of the pad electrodes, a non-volatile memory circuit storing a primary repair data, and a repair circuit; and
a second semiconductor chip including a plurality of TSVs and a plurality of second latch circuits assigned to an associated one of the TSVs,
wherein each of the TSVs is electrically connected to an associated one of the pad electrodes to form a plurality of signal paths,
wherein one or ones of the signal paths in which the first and second latch circuits corresponding thereto store a fail signal is invalidate,
wherein the repair circuit is configured to perform a primary repair operation and a secondary repair operation in this order,
wherein the primary repair operation includes reading the primary repair data from the non-volatile memory circuit and writing the fail signal to one or ones of the first and second latch circuits corresponding to defective one or ones of the signal paths indicated by the primary repair data,
wherein the secondary repair operation includes testing the signal paths and writing the fail signal to another one or ones of the first and second latch circuits corresponding to defective another one or ones of the signal paths detected by the testing, and
wherein the testing and the writing in the secondary repair operation are alternately performed.

10. The apparatus of claim 9, wherein the repair circuit is configured to perform the primary repair operation and the secondary repair operation each time a power is activated.

11. The apparatus of claim 9,
wherein the repair circuit includes a clock generation circuit configured to generate a clock signal, and
wherein the testing and the writing in the secondary repair operation corresponding to each of the signal paths are performed within one clock cycle.

12. The apparatus of claim 11,
wherein the first semiconductor chip further includes a discharge circuit configured to discharge a selected one of the signal paths by the repair circuit,
wherein the second semiconductor chip further includes a charge circuit configured to charge the selected one of the signal paths by the repair circuit,
wherein the selected one of the signal paths is discharged during a former half of the clock cycle and charged during a latter half of the clock cycle, and
wherein the testing in the secondary repair operation is performed by detecting a potential of the selected one of the signal paths at a predetermined timing during the latter half of the clock cycle.

13. The apparatus of claim 12, wherein the writing in the secondary repair operation is performed by transferring the fail signal to the first and second latch circuits during the latter half of the clock cycle.

14. The apparatus of claim 13, wherein the fail signal is supplied in common to the first latch circuits and the second latch circuits and stored in selected one of the first latch circuits and selected one of the second latch circuits.

15. The apparatus of claim 9, further comprising a plurality of third semiconductor chips arranged between the first and second semiconductor chips,
wherein each of the third semiconductor chips includes a plurality of TSVs each electrically connected to an associated one of the pad electrodes of the first semiconductor chip and a plurality of third latch circuits assigned to an associated one of the TSVs, and wherein each of the pad electrodes are electrically connected to an associated one of the TSVs of the second semiconductor chip and connected to an associated one of the TSVs of each of the third semiconductor chips to form the plurality of signal paths.

16. The apparatus of claim 15, wherein the writing in the primary repair operation is performed by writing the fail signal to one or ones of the first to third latch circuits corresponding to the defective one or ones of the signal paths indicated by the primary repair data, and wherein the writing in the secondary repair operation is performed by writing the fail signal to another one or ones of the first to third latch circuits corresponding to the defective another one or ones of the signal paths detected by the testing.

17. An apparatus comprising:

a first semiconductor chip having a plurality of TSVs arranged in row and column directions and a plurality of latch circuits provided correspondingly to the plurality of TSVs; and a second semiconductor chip stacked on the first semiconductor chip, the second semiconductor chip having a control circuit and a plurality of pads coupled correspondingly to the plurality of TSVs, wherein the control circuit is configured to:

generate a row selection signal and a column selection signal to select one of the plurality TSVs arranged at an intersection determined by the row selection signal and the column selection signal; and transfer a control signal commonly to the plurality of latch circuits in addition to the row selection signal and the column selection signal such that the control signal is stored in one of the plurality of latch circuits selected by the row selection signal and the column selection signal.

18. The apparatus of claim 17, wherein the control circuit is configured to activate the control signal when the select one of the plurality TSVs is determined to be defective.

19. The apparatus of claim 18, wherein the first semiconductor chip further has a clock generation circuit configured to generate a clock signal, and wherein the control circuit is configured to update the row selection signal and the column selection signal based on the clock signal.

20. The apparatus of claim 19, wherein the control circuit is configured to:

update the column selection signal while the row selection signal is fix to a first value each time the clock signal is activated during a first period; and update the column selection signal while the row selection signal is fix to a second value each time the clock signal is activated during a second period successive to the first period.

* * * * *